(12) United States Patent
Kim et al.

(10) Patent No.: US 10,424,352 B2
(45) Date of Patent: Sep. 24, 2019

(54) MEMORY SYSTEM AND METHOD FOR OPERATING THE SAME

(71) Applicant: SK hynix Inc., Gyeonggi-do (KR)

(72) Inventors: Nam Hoon Kim, Seoul (KR); Soo Jin Wi, Gyeonggi-do (KR); Deung Kak Yoo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/934,600

(22) Filed: Mar. 23, 2018

(65) Prior Publication Data

US 2019/0051336 A1 Feb. 14, 2019

(30) Foreign Application Priority Data

Aug. 14, 2017 (KR) .......................... 10-2017-0103160

(51) Int. Cl.
| | | |
|---|---|---|
| *G11C 7/00* | (2006.01) | |
| *G11C 7/10* | (2006.01) | |
| *G11C 7/22* | (2006.01) | |
| *G11C 16/32* | (2006.01) | |

(52) U.S. Cl.
CPC .............. *G11C 7/1063* (2013.01); *G11C 7/22* (2013.01); *G11C 16/32* (2013.01)

(58) Field of Classification Search
CPC .......... G11C 7/1063; G11C 7/22; G11C 16/32
See application file for complete search history.

(56) References Cited

U.S. PATENT DOCUMENTS

| | | | |
|---|---|---|---|
| 6,618,791 B1 * | 9/2003 | Dodd ..................... | G06F 1/3225 711/105 |
| 7,843,758 B2 * | 11/2010 | Byeon ................ | G06F 13/1684 365/185.11 |
| 9,424,901 B1 * | 8/2016 | An ......................... | G11C 7/227 |
| 2019/0051359 A1 * | 2/2019 | Yoo ........................ | G11C 16/26 |

FOREIGN PATENT DOCUMENTS

| | | |
|---|---|---|
| KR | 1020130056004 | 5/2013 |
| KR | 1020130073804 | 7/2013 |
| KR | 1020160144734 | 12/2016 |

* cited by examiner

*Primary Examiner* — Pho M Luu
(74) *Attorney, Agent, or Firm* — IP & T Group LLP

(57) ABSTRACT

There are provided a memory system and a method for operating the same. A memory system includes: a semiconductor memory device for outputting a ready/busy (R/B) signal by performing an internal operation in response to an operation command, and outputting status data by performing a status check operation in response to a status check command; and a controller for outputting the operation command and the status check command to the semiconductor memory device, and determining validity of the status data, based on the R/B signal.

20 Claims, 7 Drawing Sheets

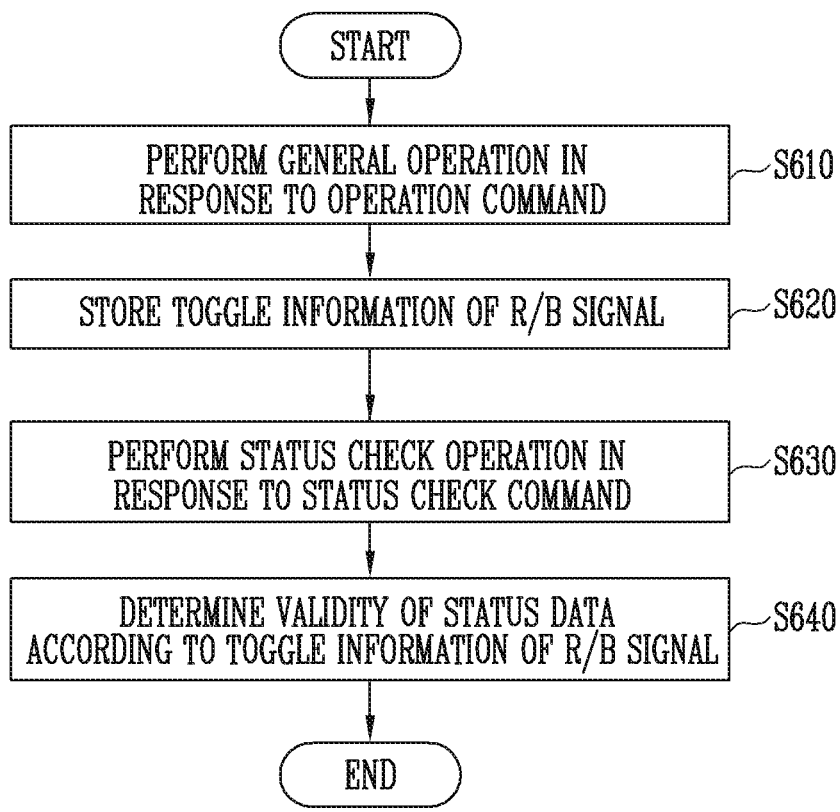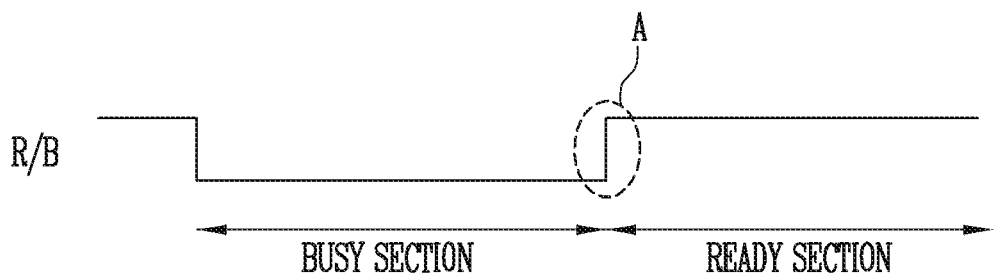

MEMORY SYSTEM AND METHOD FOR OPERATING THE SAME

CROSS-REFERENCE TO RELATED APPLICATION

The present application claims priority to Korean patent application number 10-2017-0103160 filed on Aug. 14, 2017, disclosure of which is incorporated herein by reference in its entirety.

BACKGROUND

1. Field of Invention

Various embodiments of the present disclosure relate to a memory system including a nonvolatile memory device, and more particularly, to a memory system capable of efficiently managing status check data and a method for operating the memory system.

2. Description of the Related Art

The paradigm for computer environments has changed to ubiquitous computing systems which allows users to get an access to a computer system anywhere anytime. For this reason, the use of portable electronic devices such as mobile phones, digital cameras, laptop computers, and the like has rapidly increased. The portable electronic devices generally employ a memory system using a memory device for storing data, i.e., a data storage device. The data storage device may be used as a main memory device or an auxiliary memory device of a portable electronic device.

A data storage device using a memory device provide excellent stability and durability because it does not include a mechanical driving unit. Also, the memory device is advantageous in that it may access data quickly and consume a small amount of power. Non-limiting examples of a memory device having these advantages include a universal serial bus (USB) memory device, a memory card having various interfaces, a solid state drive (SSD), and the like.

SUMMARY

Embodiments provide a memory system capable of determining whether status data obtained as a result of a status check operation is valid and a method for operating the memory system.

According to an aspect of the present disclosure, there is provided a memory system including: a semiconductor memory device configured to output a ready/busy (R/B) signal by performing an internal operation in response to an operation command, and output status data by performing a status check operation in response to a status check command; and a controller configured to output the operation command and the status check command to the semiconductor memory device, and determine validity of the status data, based on the R/B signal.

According to an aspect of the present disclosure, there is provided a memory system including: a semiconductor memory device configured to output status data by performing a status check operation; a memory unit configured to output a ready/busy (R/B) check signal in response to an R/B signal of the semiconductor memory device; and a processor configured to determine whether the status data is valid based on the R/B check signal.

According to an aspect of the present disclosure, there is provided a method for operating a memory system, the method including: performing an internal operation in response to an operation command; generating a ready/busy (R/B) signal of which signal level is toggled according to the internal operation; storing toggle information indicating that the signal level of the RIB signal is toggled; performing a status check operation in response to a status check command and generating a result of the status check operation as status data; generating an R/B check signal according to the stored toggle information; and determining validity of the status data, based on the R/B check signal.

BRIEF DESCRIPTION OF THE DRAWINGS

FIG. 6 is a flowchart illustrating a method for operating a memory system according to an embodiment of the present disclosure.

FIG. 7 is a timing diagram illustrating a ready/busy (R/B) signal according to an embodiment of the present disclosure.

DETAILED DESCRIPTION

Figure 1:
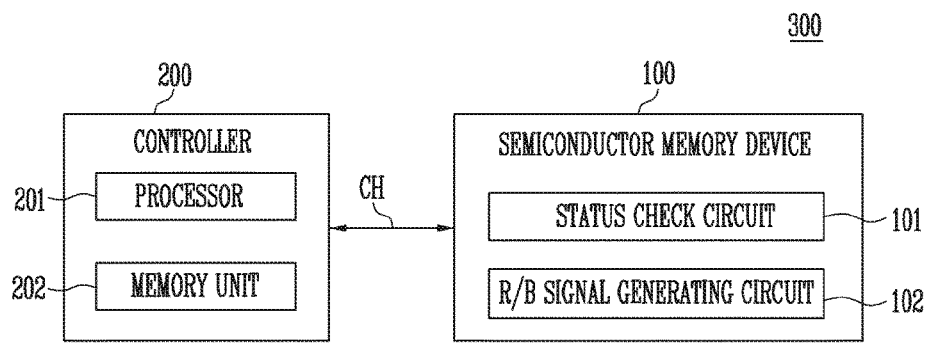
FIG. 1 is a block diagram illustrating a memory system including a semiconductor memory device and a controller according to an embodiment of the present disclosure.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure.

Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

The terminology used herein is for the purpose of describing particular embodiments only and is not intended to be limiting of the present invention.

As used herein, singular forms may include the plural forms as well, unless the context clearly indicates otherwise.

Hereinafter, the various embodiments of the present invention will be described in detail with reference to the attached drawings.

FIG. 1 is a block diagram illustrating a memory system 300 including a semiconductor memory device 100 and a controller 200 according to an embodiment of the present disclosure.

Figure 2:
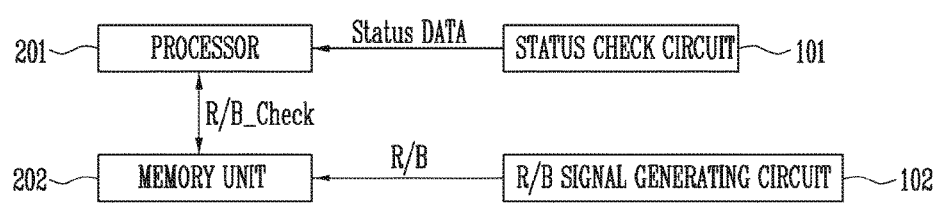
FIG. 2 is a diagram illustrating signals transmitted and received in a memory system including a processor, a memory unit, a status check circuit, and a ready/busy (R/B) signal generating circuit according to an embodiment of the present disclosure.

FIG. 2 is a diagram illustrating signals transmitted and received in a memory system according to an embodiment of the present disclosure, for example, the memory system 300 including a processor 201, a memory unit 202, a status check circuit 101, and a ready/busy (R/B) signal generating circuit 102 of FIG. 1.

Referring to FIGS. 1 and 2, the memory system 300 may include the semiconductor memory device 100 and the controller 200.

The semiconductor memory device 100 may operate in response to the control of the controller 200. The semiconductor memory device 100 may include a memory cell array having a plurality of memory blocks. In an embodiment, the semiconductor memory device 100 may be a flash memory device.

The semiconductor memory device 100 may receive a command and an address from the controller 200 through a channel CH, and access a region selected by the address in the memory cell array. That is, the semiconductor memory device 100 may perform an internal operation corresponding to the command on the region selected by the address.

For example, the semiconductor memory device 100 may perform a general operation including a program operation, a read operation, an erase operation, and the like. In the program operation, the semiconductor memory device 100 may program or write data in the region of the memory cell array selected by the address. In the read operation, the semiconductor memory device 100 may read data from the region of the memory cell array selected by the address. In the erase operation, the semiconductor memory device 100 may erase data stored in the region of the memory cell array selected by the address.

The semiconductor memory device 100 may include the status check circuit 101 and the R/B signal generating circuit 102. After a general operation of the semiconductor memory device 100 is performed, the controller 200 may receive a status check command. If a status check command is received from the controller 200, the status check circuit 101 may determine whether a corresponding memory block among the plurality of memory blocks included in the semiconductor memory device 100 is a normal memory block on which the general operation is normally performed or a bad memory block. In some embodiments, the status check circuit 101 may determine whether the corresponding memory block is a normal memory block or a bad memory block, by performing a status check operation on the corresponding memory block. After determining the corresponding memory block, the status check circuit 101 may output status data Status DATA to the processor 201 of the controller 200.

The RIB signal generating circuit 102 may output, to the memory unit 202 of the controller 200, an R/B signal RIB indicating whether the semiconductor memory device 100 corresponds to a ready status or a busy status.

When the semiconductor memory device 100 corresponds to the ready status, it may mean that the corresponding semiconductor memory device 100 has completed an internal operation such as a program, read, or erase operation corresponding to the command, and is then standing by.

When the semiconductor memory device 100 corresponds to the busy status, it may mean that the corresponding semiconductor memory device 100 is still performing an internal operation such as a program, read, or erase operation corresponding to the command.

In an embodiment, the RIB signal generating circuit 102 may be coupled to the controller 200 through an RIB line (not shown) distinguished from the channel CH, and may output an R/B signal RIB through the R/B line. For example, when the RIB signal RIB is disabled as logical value 'high', it may mean that the semiconductor memory device 100 corresponds to the ready status, and when the R/B signal RIB is enabled as logical value 'low', it may mean that the semiconductor memory device 100 corresponds to the busy status.

The controller 200 may include the processor 201 and the memory unit 202. The processor 201 may control the semiconductor memory device 100 in response to a command (or request) received from a host (not shown). In a status check operation, the processor 201 may receive status data Status DATA from the status check circuit 101 to determine a status of the semiconductor memory device 100. Also, the processor 201 may receive an R/B check signal R/B_Check from the memory unit 202 to check whether the internal operation of the semiconductor memory device 100 has been completed, thereby determining validity of the status data Status DATA. For example, the processor 201 may determine that the status data Status DATA is valid only when the internal operation of the semiconductor memory device 100 is completely performed according to the R/B check signal R/B_Check. When it is determined that the internal operation of the semiconductor memory device 100 is not performed according to the R/B check signal R/B_Check, the processor 201 may determine that the status check operation is erroneously performed by allowing the status data Status DATA to be invalid even when the status data Status DATA is received from the semiconductor memory device 100.

The memory unit 202 may receive an R/B signal RIB from the R/B signal generating circuit 102 of the semiconductor memory device 100, may store toggle information for the R/B signal RIB, and may output the stored toggle information as an RIB check signal R/B_Check. In some embodiments, the memory unit 202 may store toggle information indicating that the signal level of the R/B signal R/B is toggled from a first level (e.g., a low level) to a second level (e.g., a high level). For example, when an internal operation is completed after the semiconductor memory device 100 performs the internal operation, the R/B signal generating circuit 102 may output an R/B signal R/B of which signal level is toggled from the low level to the high level. The memory unit 202 may store toggle information indicating that the signal level of the R/B signal R/B is toggled from the first level to the second level, and may output the stored toggle information as an R/B check signal R/B_Check having a first signal level. Alternatively, when the signal level of the R/B signal R/B is not toggled from the first level to the second level, the memory unit 202 may output an R/B check signal R/B_Check having a second signal level.

As described above, according to the embodiment of the present disclosure, the processor 201 of the controller 200 may determine that only status data Status DATA received after the semiconductor memory device 100 performs the internal operation is valid. In contrast, the processor 201 may determine status data Status DATA, other than those that were determined to be valid status data, as invalid data caused by the status check operation being erroneously performed.

The controller 200 may control the semiconductor memory device 100 through the channel CH. The controller 200 may command the semiconductor memory device 100 in response to a request from a host (not shown). When the R/B signal R/B represents the ready status, the controller 200 may command the semiconductor memory device 100 to perform a specific operation. When the R/B signal R/B represents the busy status, the controller 200 may stand by until the R/B signal R/B represents the ready status, and then command the semiconductor memory device 100.

In an embodiment, the controller 200 may control the semiconductor memory device 100 to perform a program operation, a read operation, an erase operation, or the like. In the program operation, the controller 200 may provide a program command, an address, and data to the semiconductor memory device 100 through the channel CH. In the read operation, the controller 200 may provide a read command and an address to the semiconductor memory device 100 through the channel CH. In the erase operation, the controller 200 may provide an erase command and an address to the semiconductor memory device 100 through the channel CH.

Figure 3:
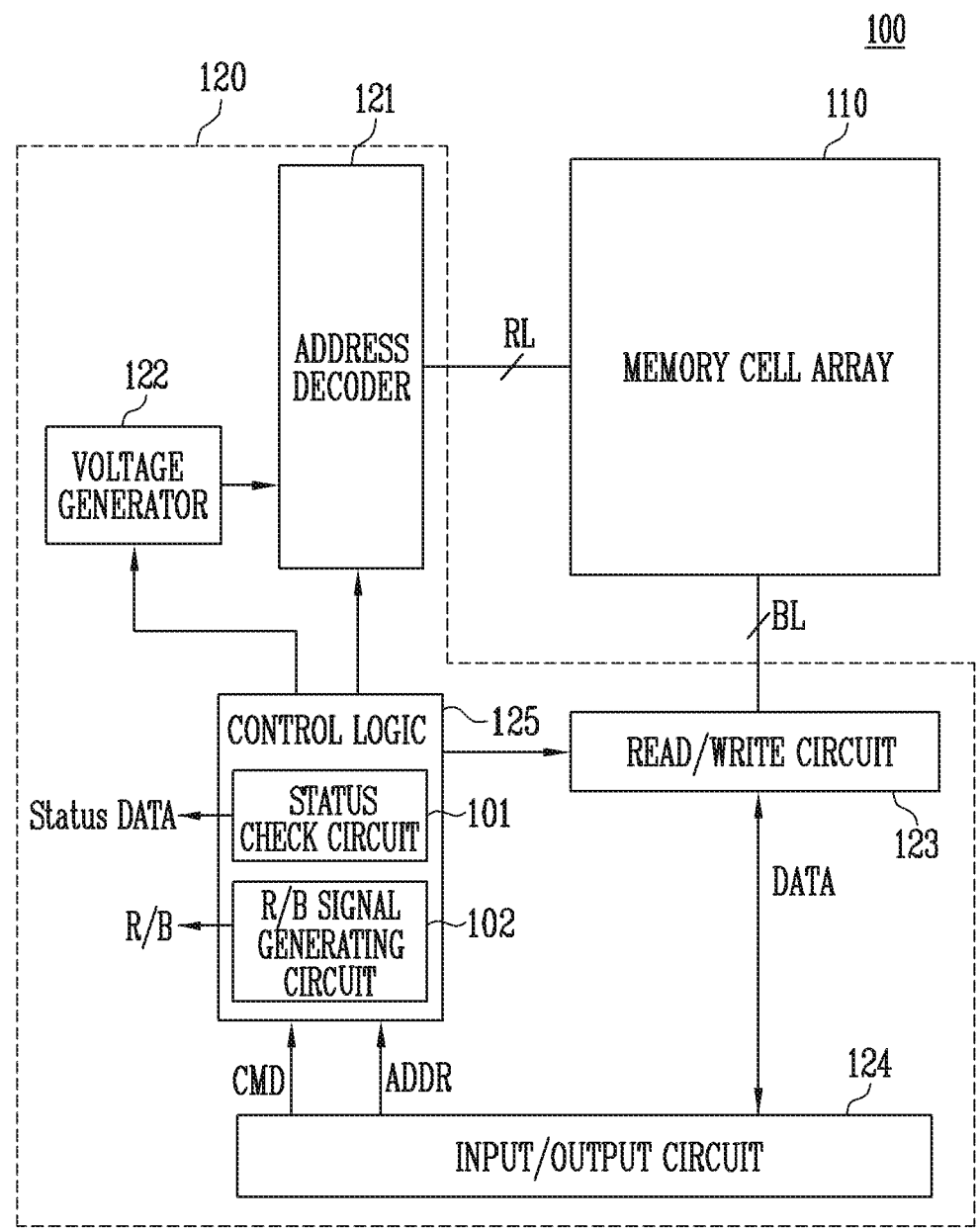
FIG. 3 is a block diagram illustrating a semiconductor memory device according to an embodiment of the present disclosure.

FIG. 3 is a block diagram illustrating a semiconductor memory device according to an embodiment of the present disclosure, for example, the semiconductor memory device 100 of FIG. 1.

Referring to FIG. 3, the semiconductor memory device 100 may include a memory cell array 110 and a peripheral circuit 120. The peripheral circuit 120 may include an address decoder 121, a voltage generator 122, a read and write circuit 123, an input and output circuit 124, and a control logic 150.

The memory cell array 110 may be coupled to the address decoder 121 through row lines RL. The memory cell array 110 may be coupled to the read and write circuit 123 through bit lines BL.

The memory cell array 110 may include a plurality of memory blocks. Each of the plurality of memory blocks may include a plurality of pages. Each of the plurality of pages may include a plurality of memory cells. In an embodiment, the plurality of memory cells may be nonvolatile memory cells. This will be described in more detail with reference to FIGS. 4 and 5.

The address decoder 121 may be coupled to the memory cell array 110 through the row lines RL. The address decoder 121 may control the row lines RL in response to the control of the control logic 125. The address decoder 121 may receive an address ADDR from the control logic 125.

In an embodiment, program and read operations of the semiconductor memory device 100 may be performed in units of pages. In the program and read operations, an address ADDR may include a block address and a row address. The address decoder 121 may decode a block address in the received address ADDR. The address decoder 121 may select one memory block according to the decoded block address. The address decoder 121 may be configured to decode a row address in the received address ADDR. The address decoder 121 may select any one page of the selected memory block according to the decoded row address.

In an embodiment, an erase operation of the semiconductor memory device 100 may be performed in units of memory blocks. In the erase operation, an address ADDR may include a block address. The address decoder 121 may decode a block address and select one memory block according to the decoded block address.

In an embodiment, the address decoder 121 may include a block decoder, a row decoder, an address buffer, and the like.

The voltage generator 122 may operate in response to the control of the control logic 125. The voltage generator 122 may generate an internal power voltage by using an external power voltage supplied to the semiconductor memory device 100. For example, the voltage generator 122 may generate an internal power voltage by regulating an external power voltage. The generated internal power voltage may be provided to the address decoder 121, the read and write circuit 123, the input and output circuit 124, and the control logic 125 to be used as an operating voltage of the semiconductor memory device 100.

The voltage generator 122 may generate a plurality of voltages by using at least one of the external power voltage and the internal power voltage. In an embodiment, the voltage generator 122 may include a plurality of pumping capacitors that receive the internal power voltage, and generate a plurality of voltages by selectively activating the plurality of pumping capacitors in response to the control of the control logic 125. For example, the voltage generator 122 may generate various voltages to be applied to the row lines RL, and provide the generated voltages to the address decoder 121.

The read and write circuit 123 may be coupled to the memory cell array 110 through the bit lines BL. The read and write circuit 123 may operate in response to the control of the control logic 125.

In a program operation, the read and write circuit 123 may transfer data DATA from the input and output circuit 124 to the bit lines BL. Memory cells of a selected page may be programmed according to the transferred data DATA. In a read operation, the read and write circuit 123 may read data DATA from the memory cells of the selected page through the bit lines BL, and may output the read data DATA to the input and output circuit 124. In an erase operation, the read and write circuit 123 may allow the bit lines BL to be floated.

In a status check operation, the read and write circuit 123 may check a status of a selected memory block and may output the checked status to the control logic 125.

The control logic 125 may be coupled to the address decoder 121, the voltage generator 122, the read and write circuit 123, and the input and output circuit 124. The control logic 125 may receive a command CMD and an address ADDR from the input and output circuit 124. The control logic 125 may control the semiconductor memory device 100 to perform an internal operation corresponding to the command CMD. The control logic 125 may transmit the address ADDR to the address decoder 121.

The control logic 125 may include a status check circuit 101 and a ready/busy (R/B) signal generating circuit 102. The status check circuit 101 and the R/B signal generating circuit 102 may correspond to the status check circuit 101 and the R/B signal generating circuit 102, which are described with reference to FIG. 1, respectively. The control logic 125 may output, to the controller 200 of FIG. 1, a result of the status check operation of the semiconductor memory device 100 as status data Status DATA and information on an operational status of the semiconductor memory device 100 as an RJB signal RJB.

Figure 4:
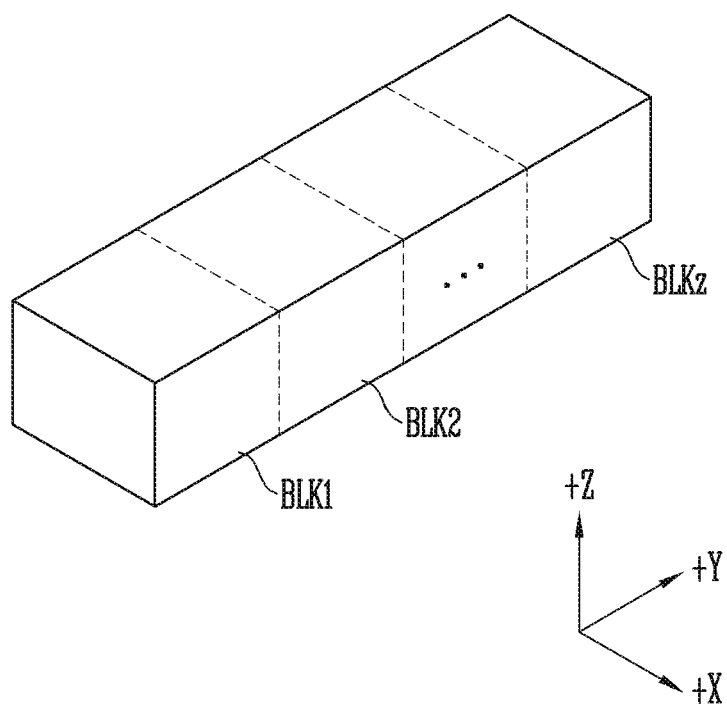
FIG. 4 is a diagram illustrating a memory cell array according to an embodiment of the present disclosure.

FIG. 4 is a diagram illustrating a memory cell array according to an embodiment of the present disclosure, for example, the memory cell array 110 of FIG. 3.

Referring to FIG. 4, the memory cell array 110 may include a plurality of memory blocks BLK1 to BLKz. Each memory block may have a three-dimensional (3-D) structure. Each memory block may include a plurality of memory cells stacked above a substrate (not shown). The plurality of memory cells may be arranged along +X, +Y, and +Z directions. Although FIG. 4 shows memory blocks having the 3-D structure, the present disclosure is not limited thereto, and may also be embodied in a two-dimensional structure.

Figure 5:
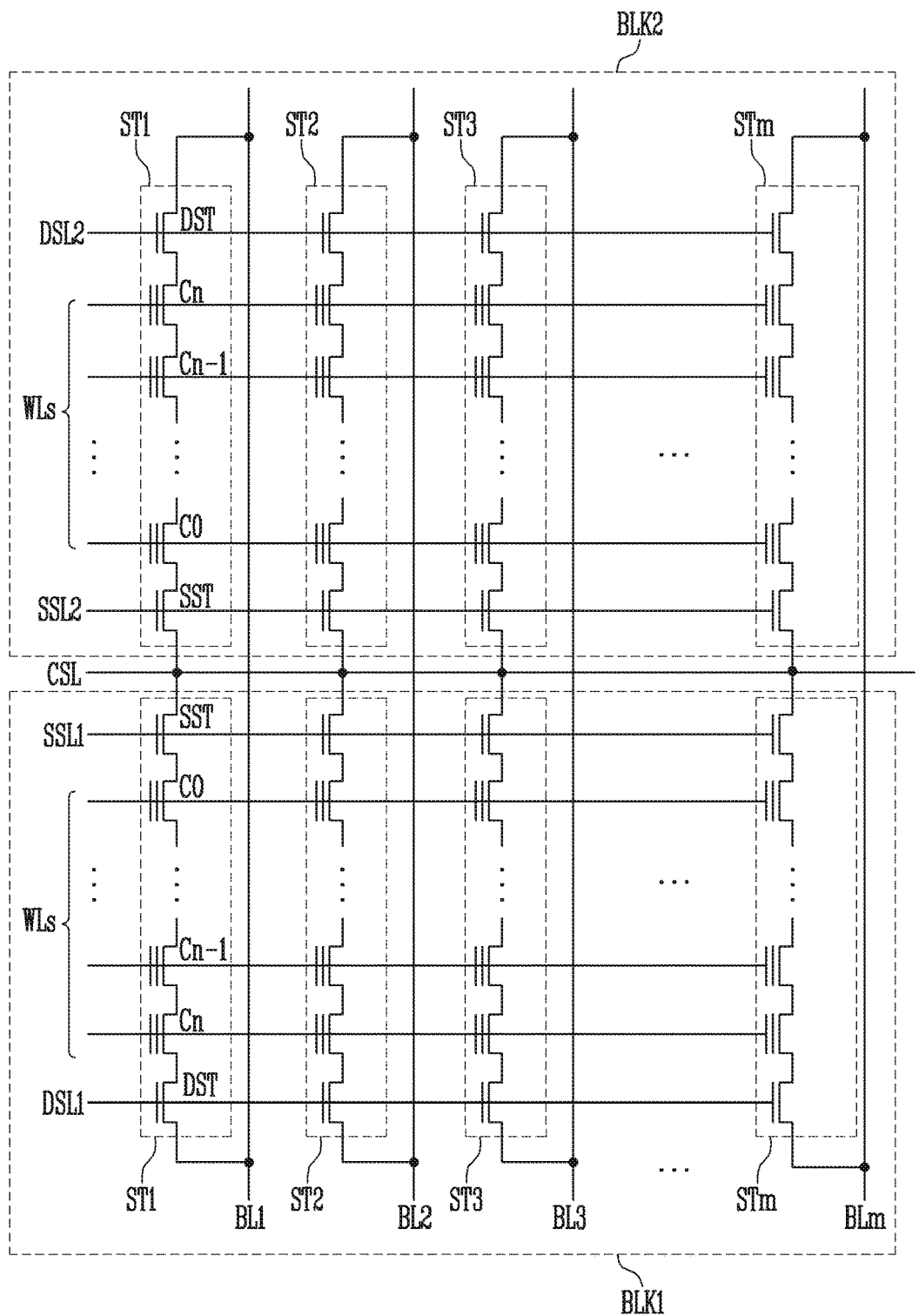
FIG. 5 is a circuit diagram illustrating memory blocks according to an embodiment of the present disclosure.

FIG. 5 is a circuit diagram illustrating memory blocks according to an embodiment of the present disclosure, for example, memory blocks included in the memory cell array 110 of FIG. 4.

In FIG. 4, the memory cell array 110 may be configured to include a plurality of memory blocks BLK1 to BLKz. However, for convenience of description, a memory block BLK1 and a memory block BLK2 are representatively illustrated in FIG. 5. The memory block BLK1 and the memory block BLK2 may have structures sharing bit lines BL1 to BLm and a common source line CSL.

Referring to FIG. 5, the memory block BLK1 and the memory block BLK2 may be coupled to a plurality of bit lines BL1 to BLm.

The memory block BLK1 may include a plurality of cell strings ST1 to STm. The plurality of cell strings ST1 to STm may be coupled between the plurality of bit lines BL1 to BLm and the common source line CSL, respectively. Each of the plurality of cell strings ST1 to STm may include a source select transistor SST, a plurality of memory cells C0 to Cn coupled in series, and a drain select transistor DST. The source select transistor SST may be coupled to a source select line SSL1. The plurality of memory cells C0 to Cn may be coupled to each word lines WLs, respectively. The drain select transistor DST may be coupled to a drain select line DSL1. The common source line CSL may be coupled to a source of the source select transistor SST. Each of the bit lines BL1 to BLm may be coupled to a drain of a corresponding drain select transistor DST.

The memory block BLK2 may be configured in a structure similar to that of the memory block BLK1. That is, the memory block BLK2 may include a plurality of cell strings ST1 to STm. The plurality of cell strings ST1 to STm may be coupled between the plurality of bit lines BL1 to BLm and the common source line CSL, respectively. Each of the plurality of cell strings ST1 to STm may include a source select transistor SST, a plurality of memory cells C0 to Cn coupled in series, and a drain select transistor DST. The source select transistor SST may be coupled to a source select line SSL2. The plurality of memory cells C0 to Cn may be coupled to each word lines WLs, respectively. The drain select transistor DST may be coupled to a drain select line DSL2. The common source line CSL may be coupled to a source of the source select transistor SST. Each of the bit lines BL1 to BLm may be coupled to a drain of a corresponding drain select transistor DST.

As described above, the memory block BLK1 and the memory block BLK2 may be configured in structures similar to each other, and may be designed to have a structure in which the drain select lines DSL1 and DSL2 and the source select lines SSL1 and SSL2 are electrically isolated from each other.

FIG. 6 is a flowchart illustrating a method for operating a memory system according to an embodiment of the present disclosure. For example, the memory system may be the memory system 300 in FIGS. 1 and 2.

FIG. 7 is a timing diagram illustrating a ready/busy (R/B) signal according to an embodiment of the present disclosure.

In describing a method for operating the memory system according to an embodiment of the present disclosure, references will be made to FIGS. 1 to 7.

The controller 200 may command the semiconductor memory device 100 in response to a request from a host (not shown). In an embodiment, the controller 200 may control the semiconductor memory device 100 to perform a program operation, a read operation, an erase operation, or the like. In the program operation, the controller 200 may provide a program command, an address, and data to the semiconductor memory device 100 through the channel CH. In a read operation, the controller 200 may provide a read command and an address to the semiconductor memory device 100 through the channel CH. In the erase operation, the controller 200 may provide an erase command and an address to the semiconductor memory device 100 through the channel CH.

At step S610, the semiconductor memory device 100 may perform a general operation such as a program operation, a read operation, or an erase operation in response to a command received from the controller 200.

At this time, when the semiconductor memory device 100 performs an internal operation, the RJB signal generating circuit 102 of the control logic 125 may output an R/B signal RJB. For example, the R/B signal R/B may have a low level in a busy period as shown in FIG. 7.

If the internal operation of the semiconductor memory device 100 is completed, the RJB signal generating circuit 102 may toggle the R/B signal R/B and output the toggled RJB signal R/B. For example, the RJB signal generating circuit 102 may toggle a first level (e.g., low level) of the R/B signal RJB to a second level (e.g., a high level) at a time point A when the busy period is changed to a ready period as shown in FIG. 7, and output the R/B signal RJB having the high level.

Then, the memory unit 202 of the controller 200 may receive the R/B signal RJB, and store toggle information indicating that the signal level of the RJB signal R/B is toggled from the low level to the high level at step S620.

If the internal operation of the semiconductor memory device 100 is completed, the controller 200 may transmit a command for a status check operation to the semiconductor memory device 100. The semiconductor memory device 100 may perform the status check operation in response to the command for the status check operation.

The control logic 125 may control the read and write circuit 123 to check a status of a corresponding memory block among the plurality of memory blocks included in the memory cell array 110. At step S630, the status check circuit 101 of the control logic 125 may transmit status data Status DATA to the controller 200 according to information on the status of the corresponding memory block, which is received from the read and write circuit 123.

The memory unit 202 of the controller 200 may output the stored toggle information as an R/B check signal R/B_Check. For example, when the internal operation is completed after the semiconductor memory device 100 performs the internal operation, the memory unit 202 may store toggle information indicating that the signal level of the R/B signal R/B is toggled from the first level (e.g., the low level) to the second level (e.g., the high level), and output the stored toggle information as an R/B check signal R/B_Check having a first signal level. When the semiconductor memory device 100 does not perform the internal operation, the memory unit 202 may outputs an R/B check signal R/B_Check having a second signal level.

Then, at step S640, the processor 201 of the controller 200 may receive the R/B check signal R/B_Check from the memory unit 202 to check whether the internal operation of the semiconductor memory device 100 has been completely performed, thereby determining validity of the status data Status DATA. For example, the processor 201 may determine that the status data Status DATA is valid only when the internal operation of the semiconductor memory device 100 is completely performed according to the R/B check signal R/B_Check. When it is determined that the internal operation of the semiconductor memory device 100 is not performed according to the R/B check signal R/B_Check, the processor 201 may determine that the status check operation is erroneously performed by allowing the status data Status DATA to be invalid even when the status data Status DATA is received from the semiconductor memory device 100.

As described above, according to the embodiment of the present disclosure, the processor 201 of the controller 200 may determine that only status data Status DATA received after the semiconductor memory device 100 performs the internal operation is valid. In contrast, the processor 201 may determine status data Status DATA, other than those that were determined to be valid status data, as invalid data caused by status check operation being erroneously performed. Accordingly, the reliability of the status check operation can be improved.

Figure 8:
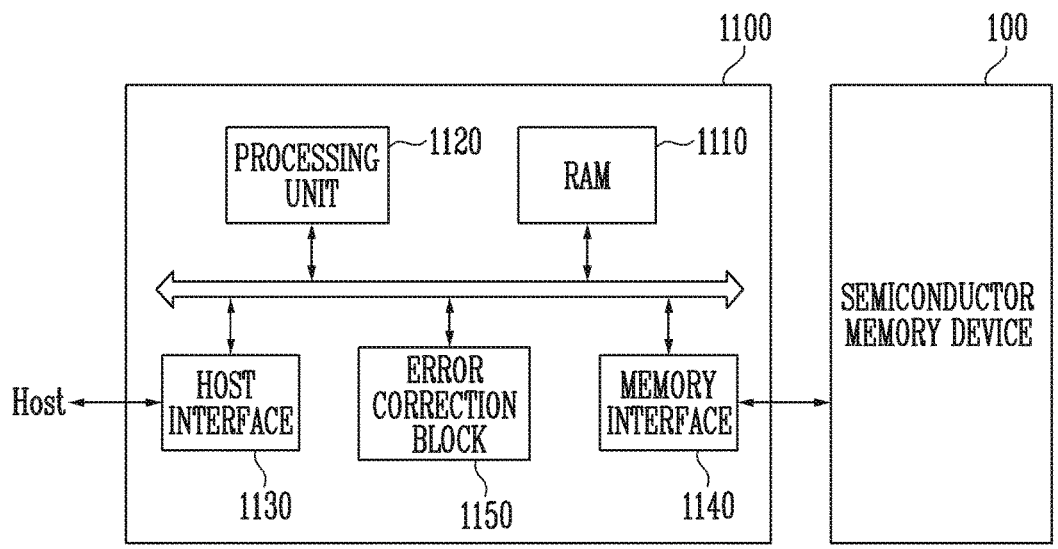
FIG. 8 is a block diagram illustrating a memory system according to another embodiment of the present disclosure.

FIG. 8 is a block diagram illustrating a memory system 1000 according to another embodiment of the present disclosure.

Referring to FIG. 8, the memory system 1000 may include a semiconductor memory device 100 and the controller 1100.

The semiconductor memory device 100 may be configured and operated in a similar manner to the one described with reference to FIG. 1. Thus, a detailed description thereof will be omitted.

The controller 1100 may be coupled between a host Host and the semiconductor memory device 100. The controller 1100 may access the semiconductor memory device 100 in response to a request from the host Host. For example, the controller 1100 may control read, write, erase, and background operations of the semiconductor memory device 100. The controller 1100 may provide an interface between the semiconductor memory device 100 and the host Host. The controller 1100 may drive firmware for controlling the semiconductor memory device 100.

The controller 1100 may include a random access memory (RAM) 1110, a processing unit 1120, a host interface 1130, a memory interface 1140, and an error correction block 1150. The RAM 1110 may correspond to the memory unit 201 shown in FIG. 1, and the processing unit 1120 may corresponds to the processor 201 shown in FIG. 1.

The host interface 1130 may include a protocol for exchanging data between the host Host and the controller 1100. In an exemplary embodiment, the controller 1100 may communicate with the host Host through at least one of various interface protocols such as a universal serial bus (USB) protocol, a multimedia card (MMC) protocol, a peripheral component interconnection (PCI) protocol, a PCI-express (PCI-e) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, and the like.

The memory interface 1140 may interface with the semiconductor memory device 100. For example, the memory interface 1140 may include a NAND interface or a NOR interface.

The error correction block 1150 may detect and correct an error of data received from the semiconductor memory device 100 by using an error correction code (ECC). For example, the processing unit 1120 may control the semiconductor memory device 100 to adjust a read voltage and to perform re-reading, based on an error detection result of the error correction block 1150. In an exemplary embodiment, the error correction block 1150 may be provided as a component of the controller 1100.

The controller 1100 and the semiconductor memory device 100 may be integrated into one semiconductor device. In an exemplary embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (personal computer memory card international association (PCMCIA)), a compact flash (CF) card, a smart media card (e.g., SM or SMC), a memory stick, a multimedia card (e.g., MMC, RS-MMC or MMCmicro), an SD card (e.g., SD, miniSD, microSD or SDHC), or a universal flash storage (UFS).

The controller 1100 and the semiconductor memory device 100 may be integrated into one semiconductor device to constitute a semiconductor drive (e.g., solid state drive (SSD)). The semiconductor drive SSD may include a storage device configured to store data in a semiconductor memory. If the memory system 1000 is used as the semiconductor drive SSD, the operating speed of the host Host coupled to the memory system 1000 may be significantly improved.

As another example, the memory system 1000 may be provided as one of various components of an electronic device such as a computer, a ultra mobile PC (UMPC), a workstation, a net-book, a personal digital assistant (PDA), a portable computer, a web tablet, a wireless phone, a mobile phone, a smart phone, an e-book, a portable multimedia player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an exemplary embodiment, the semiconductor memory device 100 or the memory system 1000 may be packaged in various forms. For example, the semiconductor memory device 100 or the memory system 1000 may be packaged in a manner such as package on package (PoP), ball grid arrays (BGAs), chip scale packages (CSPs), plastic leaded chip carrier (PLCC), plastic dual in-line package (PDIP), die in Waffle pack, die in wafer form, chip on board (COB), ceramic dual in-line package (CERDIP), plastic metric quad flat pack (MQFP), thin quad flat pack (TQFP), small outline integrated circuit (SOIC), shrink small out line package (SSOP), thin small outline package (TSOP), thin quad flat pack (TQFP), system in package (SIP), multi chip package (MCP), wafer-level fabricated package (WFP), or wafer-level processed stack package (WSP).

Figure 9:
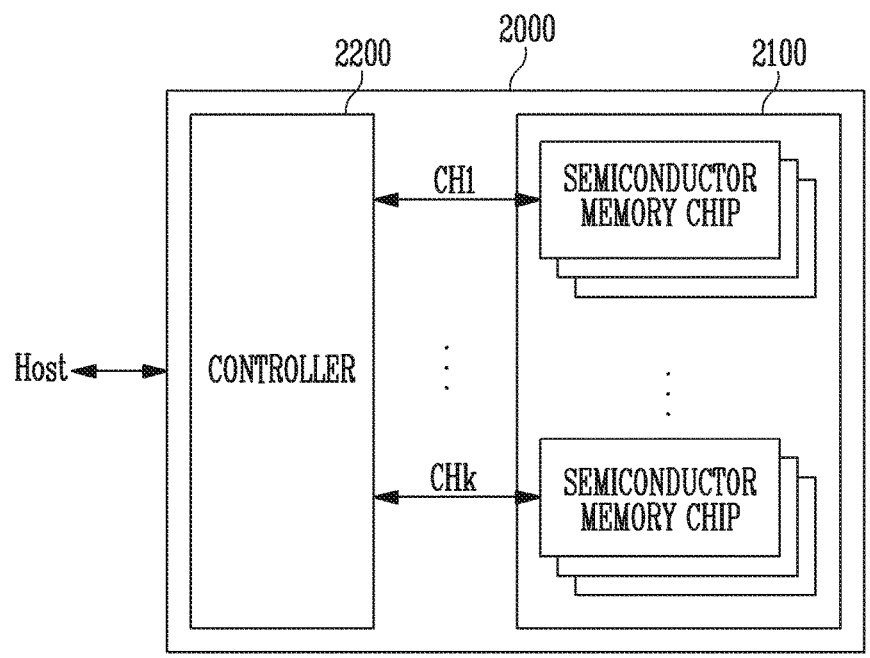
FIG. 9 is a block diagram illustrating an application example of a memory system according to another embodiment of the present disclosure.

FIG. 9 is a block diagram illustrating an application example of a memory system 2000 according to another embodiment of the present disclosure, for example, the memory system 1000 of FIG. 8.

Referring to FIG. 9, the memory system 2000 may include a semiconductor memory device 2100 and a controller 2200. The semiconductor memory device 2100 may include a plurality of semiconductor memory chips. The plurality of semiconductor memory chips may be divided into a plurality of groups.

In FIG. 9, it is illustrated that the plurality of groups communicate with the controller 2200 through first to kth channels CH1 to CHk. Each semiconductor memory chip may be configured and operated in a similar manner to the semiconductor memory device 100 described with reference to FIG. 1.

Each group from the plurality of semiconductor memory chips divided into a plurality of groups may communicate with the controller 2200 through one common channel. The controller 2200 may be configured similarly to the controller 1100 described with reference to FIG. 8. The controller 2200 may control the plurality of memory chips of the semiconductor memory device 2100 through the plurality of channels CH1 to CHk.

Figure 10:
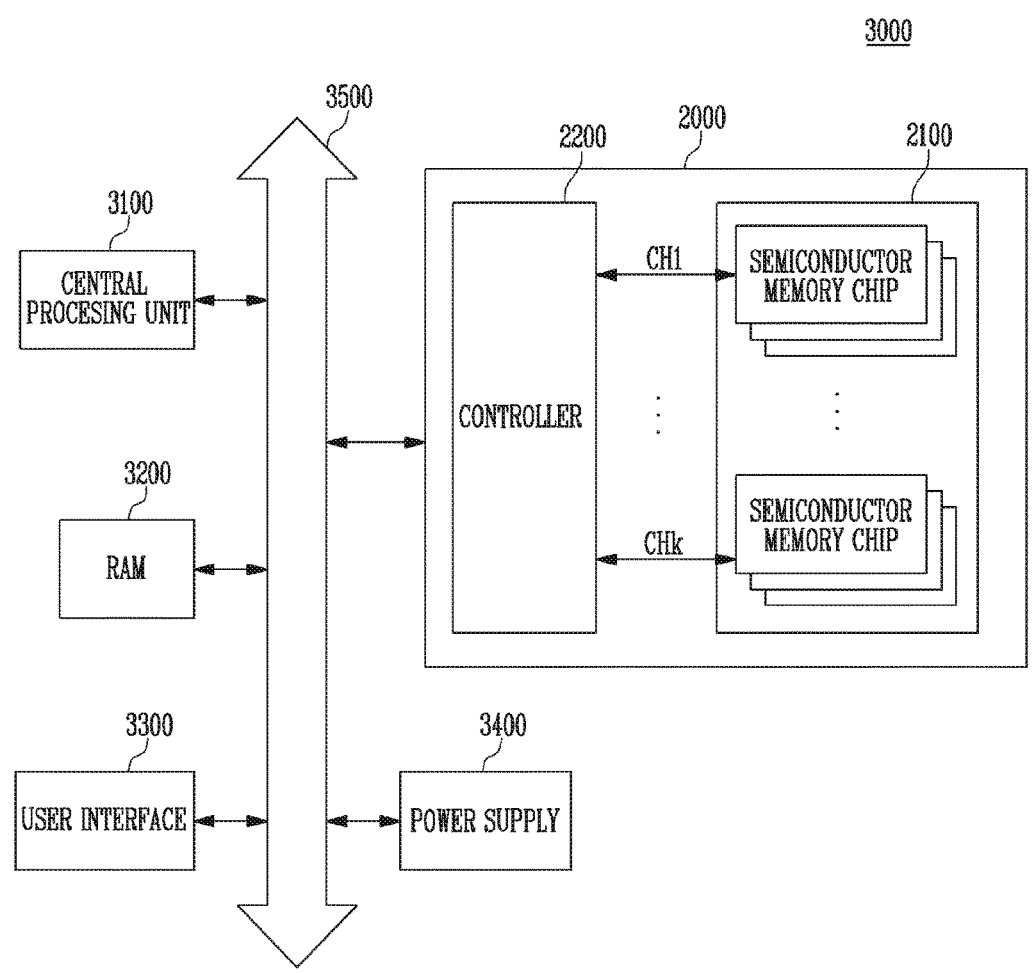
FIG. 10 is a block diagram illustrating a computing system including a memory system according to another embodiment of the present disclosure.

FIG. 10 is a block diagram illustrating a computing system 3000 including a memory system according to another embodiment of the present disclosure, for example, the memory system 2000 described with reference to FIG. 9.

Referring to FIG. 10, the computing system 300 may include a central processing unit 3100, a random access memory (RAM) 3200, a user interface 3300, a power supply 3400, a system bus 3500, and the memory system 2000.

The memory system 2000 may be electrically coupled to the central processing unit 3100, the RAM 3200, the user interface 3300, and the power supply 3400 through the system bus 3500. Data supplied through user interface 3300 or data processed by the central processing unit 3100 may be stored in the memory system 2000.

In FIG. 10, although it is illustrated that the semiconductor memory device 2100 may be coupled to the system bus 3500 through the controller 2200, the present disclosure is not limited thereto and the semiconductor memory device 2100 may be directly coupled to the system bus 3500. In that case, the function of the controller 2200 may be performed by the central processing unit 3100 and the RAM 3200.

In FIG. 10, although the computing system 3000 is illustrated with reference to memory system 2000 described in FIG. 9, the memory system 2000 may be replaced by the memory system 1000 described with reference to FIG. 8. Furthermore, in an exemplary embodiment, the computing system 3000 may be configured to include both of the memory systems 1000 and 2000 described with reference to FIGS. 8 and 9.

According to the present disclosure, in a status check operation of the semiconductor memory device, validity of status data is determined by checking whether a ready/busy (R/B) signal of the semiconductor memory device is toggled, so that the reliability of the status check operation may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory system comprising:
a semiconductor memory device configured to output a ready/busy (R/B) signal by performing an internal operation in response to an operation command, and output status data by performing a status check operation in response to a status check command, the status data generated as a result of the status check operation of checking whether a memory block included in the semiconductor memory device is a normal memory block on which a general operation is normally performed, or a bad block, the ready/busy (R/B) signal indicating whether the semiconductor memory device is in a ready status or a busy status; and
a controller configured to output the operation command and the status check command to the semiconductor memory device, check whether the general operation of the semiconductor memory device is completed according to the ready/busy (R/B) signal received from the semiconductor memory device, and determine validity of the status data received from the semiconductor memory device according to a check result.

2. The memory system of claim 1, wherein the semiconductor memory device includes:
an R/B signal generating circuit configured to output the R/B signal according to the internal operation; and
a status check circuit configured to output the result of the status check operation as the status data.

3. The memory system of claim 2, wherein the controller includes:
a memory unit configured to store toggle information of the R/B signal, and output the toggle information stored in the status check operation as an R/B check signal; and
a processor configured to determine the validity of the status data based on the R/B check signal.

4. The memory system of claim 3, wherein the R/B signal generating circuit outputs the R/B signal having a first level when the semiconductor memory device performs the internal operation, and
wherein, if the internal operation is completed, the R/B signal generating circuit toggles the signal level of the R/B signal from the first level to a second level, and outputs the R/B signal having the second level.

5. The memory system of claim 4, wherein the memory unit stores toggle information when the signal level of the R/B signal is toggled from the first level to the second level, and outputs the stored toggle information as the R/B check signal having a first signal level.

6. The memory system of claim 5, wherein the processor determines that the status data is valid based on the R/B check signal having the first signal level.

7. The memory system of claim 4, wherein the memory unit outputs the R/B check signal having a second signal level when the signal level of the R/B signal is not toggled from the first level to the second level.

8. The memory system of claim 7, wherein the processor determines that the status data is invalid in response to the R/B check signal having the second signal level.

9. A memory system comprising:
a semiconductor memory device configured to output status data by performing a status check operation, the status data generated as a result of the status check operation of checking whether a memory block included in the semiconductor memory device is a normal memory block on which a general operation is normally performed, or a bad memory block;
a memory unit configured to output a ready/busy (R/B) check signal in response to an R/B signal of the semiconductor memory device, the R/B signal indicating whether the semiconductor memory device is in a ready status or a busy status; and
a processor configured to determine whether the status data is valid based on the R/B check signal.

10. The memory system of claim 9, wherein the processor outputs an operation command and a status check command to the semiconductor memory device.

11. The memory system of claim 10, wherein the semiconductor memory device performs an internal operation in response to the operation command, performs the status check operation in response to the status check command, and outputs the R/B signal according to the internal operation.

12. The memory system of claim 11, wherein the semiconductor memory device includes:
a status check circuit configured to output the result of the status check operation as the status data; and
an R/B signal generating circuit configured to output the R/B signal according to the internal operation.

13. The memory system of claim 12, wherein the R/B signal generating circuit outputs the R/B signal having a first level when the semiconductor memory device performs the internal operation, and
wherein, if the internal operation is completed, the R/B signal generating circuit toggles the signal level of the R/B signal from the first level to a second level, and outputs the R/B signal having the second level.

14. The memory system of claim 13, wherein the memory unit stores toggle information indicating that the signal level of the R/B signal is toggled from the first level to the second level, and
wherein the memory unit outputs the R/B check signal having a first signal level when the signal level of the R/B signal is toggled from the first level to the second level, and outputs the R/B check signal having a second signal level when the R/B signal is not toggled.

15. The memory system of claim 14, wherein the processor:
determines that the status data is valid based on the R/B check signal having the first signal level; and
determines that the status data is invalid based on the R/B check signal having the second signal level.

16. A method for operating a memory system, the method comprising:
performing an internal operation in response to an operation command;
generating a ready/busy (R/B) signal of which signal level is toggled when the internal operation is completed;
storing toggle information indicating that the signal level of the R/B signal is toggled;
performing a status check operation in response to a status check command and generating a result of the status check operation as status data;
performing the status check operation of checking whether a memory block on which the internal operation is performed is a normal memory block, or a bad block in response to the status check command, and generating the status check data according to the result of the status check operation;
generating an R/B check signal according to the stored toggle information; and
determining validity of the status data, based on the R/B check signal.

17. The method of claim 16, wherein the R/B signal is output to have a first level while the internal operation is being performed, and is generated to have a second level when the internal operation is not performed.

18. The method of claim 17, wherein, when the internal operation is completed, the R/B signal is generated such that the signal level of the R/B signal is toggled from the first level to the second level.

19. The method of claim 18, wherein the R/B check signal:
is generated to have a first signal level according to the toggle information when the signal level of the R/B signal is toggled from the first level to the second level; and
is generated to have a second signal level according to the toggle information when the R/B signal is not toggled.

20. The method of claim 19, wherein the status data:
is determined to be valid according to the R/B check signal having the first signal level; and
is determined to be invalid according to the R/B check signal having the second signal level.

* * * * *